United States Patent
Lu et al.

(10) Patent No.: US 10,409,178 B2
(45) Date of Patent: Sep. 10, 2019

(54) ALIGNMENT CONTROL IN NANOIMPRINT LITHOGRAPHY BASED ON REAL-TIME SYSTEM IDENTIFICATION

(71) Applicant: CANON KABUSHIKI KAISHA, Tokyo (JP)

(72) Inventors: Xiaoming Lu, Cedar Park, TX (US); Byung-Jin Choi, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/845,634

(22) Filed: Dec. 18, 2017

(65) Prior Publication Data

US 2019/0187575 A1  Jun. 20, 2019

(51) Int. Cl.
*G03F 7/20* (2006.01)
*G03F 9/00* (2006.01)
*G03F 7/00* (2006.01)

(52) U.S. Cl.
CPC .......... *G03F 9/7046* (2013.01); *G03F 7/0002* (2013.01); *G03F 9/7088* (2013.01); *G03F 9/7096* (2013.01)

(58) Field of Classification Search
CPC .... G03F 9/7046; G03F 7/0002; G03F 9/7088; G03F 9/7096
See application file for complete search history.

(56) References Cited

U.S. PATENT DOCUMENTS

| | | | |
|---|---|---|---|
| 6,916,584 B2 | 7/2005 | Sreenivasan et al. | |
| 6,916,585 B2 | 7/2005 | Sreenivasan et al. | |
| 6,932,934 B2 | 8/2005 | Choi et al. | |
| 7,027,156 B2 | 4/2006 | Watts et al. | |
| 7,157,036 B2 | 1/2007 | Choi et al. | |
| 7,170,589 B2 | 1/2007 | Cherala et al. | |
| 7,298,456 B2 * | 11/2007 | Cherala | B82Y 10/00 355/53 |
| 7,420,654 B2 | 9/2008 | Cherala et al. | |
| 7,794,222 B2 * | 9/2010 | Suehira | B82Y 10/00 264/293 |
| 8,387,482 B2 * | 3/2013 | Choi | B29C 43/021 74/490.09 |
| 2004/0021866 A1 * | 2/2004 | Watts | B29C 35/0888 356/401 |
| 2004/0124566 A1 | 7/2004 | Sreenivasan et al. | |

(Continued)

*Primary Examiner* — Deoram Persaud
(74) *Attorney, Agent, or Firm* — Fish & Richardson P.C.

(57) ABSTRACT

An imprint lithography alignment method includes assessing a first alignment error between the template and the substrate, generating a first input signal corresponding to a first relative motion between the template and the substrate, initiating the first relative motion between the template and the substrate via the first input signal, assessing an output signal corresponding to the first relative motion, comparing the first input signal and the output signal to yield a motion control action corresponding to a second relative motion between the template and the substrate, generating a second input signal corresponding to the second relative motion between the template and the substrate, initiating the second relative motion between the template and the substrate via the second input signal, and assessing a second alignment error between the template and the substrate, wherein a magnitude of the first alignment error exceeds a magnitude of the second alignment error.

20 Claims, 10 Drawing Sheets

(56) References Cited

U.S. PATENT DOCUMENTS

| | | | |
|---|---|---|---|
| 2004/0188381 A1* | 9/2004 | Sreenivasan | B81C 1/0046 216/40 |
| 2004/0211754 A1 | 10/2004 | Sreenivasan et al. | |
| 2005/0187339 A1* | 8/2005 | Xu | B82Y 10/00 524/556 |
| 2006/0266244 A1* | 11/2006 | Kruijt-Stegeman | B41F 1/18 101/485 |
| 2007/0258079 A1* | 11/2007 | Kamidi | G03F 7/70725 355/72 |
| 2009/0220871 A1* | 9/2009 | Van Dijk | G03F 7/70508 430/30 |
| 2011/0013188 A1* | 1/2011 | Slotboom | G01B 11/0608 356/401 |
| 2012/0033193 A1* | 2/2012 | Van Der Schaar | G01N 21/9501 355/67 |
| 2013/0230797 A1* | 9/2013 | Van Der Sanden | G03F 7/70141 430/30 |
| 2016/0195823 A1* | 7/2016 | Kruijt-Stegeman | B82Y 10/00 264/40.5 |
| 2017/0282439 A1* | 10/2017 | Lu | B29C 59/002 |

\* cited by examiner

ALIGNMENT CONTROL IN NANOIMPRINT LITHOGRAPHY BASED ON REAL-TIME SYSTEM IDENTIFICATION

TECHNICAL FIELD

The disclosure relates to alignment control in nanoimprint lithography, more particularly to real time feed-forward control based on system identification and a smooth motion control action.

BACKGROUND

In nanoimprint lithography, techniques for field to field alignment have been used to achieve nanometer level overlay accuracy. In some examples, an initial alignment error between an imprint template and a corresponding field on a substrate can be corrected by moving the template relative to the substrate (e.g., a wafer). Alignment methods for nanoimprint lithography are described in detail in numerous publications, such as U.S. Pat. Nos. 8,387,482, 7,027,156, and 6,916,584, all of which are incorporated by reference herein. An alignment speed and accuracy in the related art are limited by non-linear dynamics between the template and a stage retaining the substrate that has a liquid imprint resist on top. For example, the topography of the template and the wafer, and material properties and a thickness of the imprint resist, may cause static and dynamic friction, hysteresis, or compliance of the alignment control system, etc. during the field to field alignment and result in a slow response for an input or an overshoot and oscillation from a target position.

SUMMARY

According to one aspect of the subject matter described in this application, an imprint lithography alignment method includes dispensing an imprint resist on a substrate, contacting the imprint resist with a template in which the imprint resist is a liquid, assessing a first alignment error between the template and the substrate, generating a first input signal corresponding to a first relative motion between the template and the substrate, initiating the first relative motion between the template and the substrate via the first input signal, assessing an output signal corresponding to the first relative motion, comparing the first input signal and the output signal to yield a motion control action of a second relative motion between the template and the substrate, generating a second input signal corresponding to the second relative motion between the template and the substrate, initiating the second relative motion between the template and the substrate via the second input signal, and assessing a second alignment error between the template and the substrate in which a magnitude of the first alignment error exceeds a magnitude of the second alignment error.

Implementations according to this aspect may include one or more of following features. For example, the magnitude of the second alignment error may be less than or equal to a target alignment error. In some examples, comparing the first input signal and the output signal includes assessing a ratio of a magnitude of the output signal to a magnitude of the first input signal, and assessing a phase of the output signal with respect to a phase of the first input signal.

In some implementations, the motion trajectory includes a sinusoidal function of time that spans a phase value from $-\pi/2$ to $\pi/2$. The motion control action may include position, velocity, acceleration, and jerk components in which the jerk component may correspond to friction between the template and the imprint resist on the substrate in the first relative motion. In some examples, the motion control action is a sum of the position, velocity, and acceleration components.

In some implementations, generating the second input signal includes converting the motion control action to an electrical signal through a feed-forward controller. Assessing the output signal may include assessing the output signal using a non-linear state observer. Initiating the first relative motion may include providing the first input signal for a predetermined length of time to a stage on which the substrate is disposed.

In some implementations, the method further includes (i) assessing a further alignment error between the template and the substrate, (ii) generating a feedback control signal based on the further alignment error, and (iii) initiating further relative movement between the template and the substrate via the feedback control signal to move the substrate relative to the template. In some examples, the method further includes (iv) repeating the steps of (i) through (iii) until a mean value of the further alignment error is less than or equal to a target alignment error.

According to another aspect, an imprint lithography system that can control alignment of an imprint lithography template with respect to a substrate based on system identification may include a substrate stage configured to retain the substrate and a controller in communication with the substrate stage configured to, based on the substrate having a liquid imprint resist contacting the template, assess a first alignment error between the template and the substrate, generate a first input signal corresponding to a first relative motion between the template and the substrate, initiate the first relative motion between the template and the substrate via the first input signal, assess an output signal corresponding to the first relative motion, compare the first input signal and the output signal to yield a motion control action of a second relative motion between the template and the substrate, generate a second input signal corresponding to the second relative motion between the template and the substrate, initiate the second relative motion between the template and the substrate via the second input signal, and assess a second alignment error between the template and the substrate in which a magnitude of the first alignment error exceeds a magnitude of the second alignment error.

Implementations according to this aspect may include one or more of the following features. For example, the controller may include a feed-forward controller configured to convert the motion control action to an electrical signal and provide the electrical signal to the substrate stage. In some examples, the motion trajectory based on the motion control action includes a sinusoidal function of time that spans a phase value from $-\pi/2$ to $\pi/2$.

In some implementations, the system further includes a sensor configured to generate a sensor signal corresponding to a relative location of the template with respect to the substrate in which the controller is configured to receive the sensor signal for assessing the output signal and the second alignment error. In some examples, the controller includes a non-linear state observer configured to assess the output signal based on the electrical signal from the feed-forward controller and the sensor signal to yield the motion control action.

In some implementations, the controller is further configured to (i) assess a further alignment error between the template and the substrate, (ii) generate a feedback control signal based on the further alignment error, and (iii) initiate further relative movement between the template and the substrate via the feedback control signal to move the substrate relative to the template. In some examples, the controller is further configured to repeat the steps of (i) through (iii) until a mean value of the further alignment error is less than or equal to a target alignment error.

In some implementations, the controller further includes a feedback controller configured to generate the feedback control signal and provide the feedback signal to the substrate stage. The substrate stage may be configured to translate the substrate about orthogonal axes in a plane of the template and rotate the substrate about a center axis orthogonal to the plane.

Advantages of the general aspects and implementations described herein include feed-forward and feedback control of alignment errors based on real-time system identification, resulting in rapid and accurate correction of alignment errors in imprint lithography. The rapid and accurate correction with smooth transition of substrate movement into an alignment condition results in improved alignment throughput and overlay accuracy.

The details of one or more implementations of the subject matter described in this specification are set forth in the accompanying drawings and the description below. Other potential features, aspects, and advantages of the subject matter will become apparent from the description, the drawings, and the claims.

DETAILED DESCRIPTION

Figure 1:
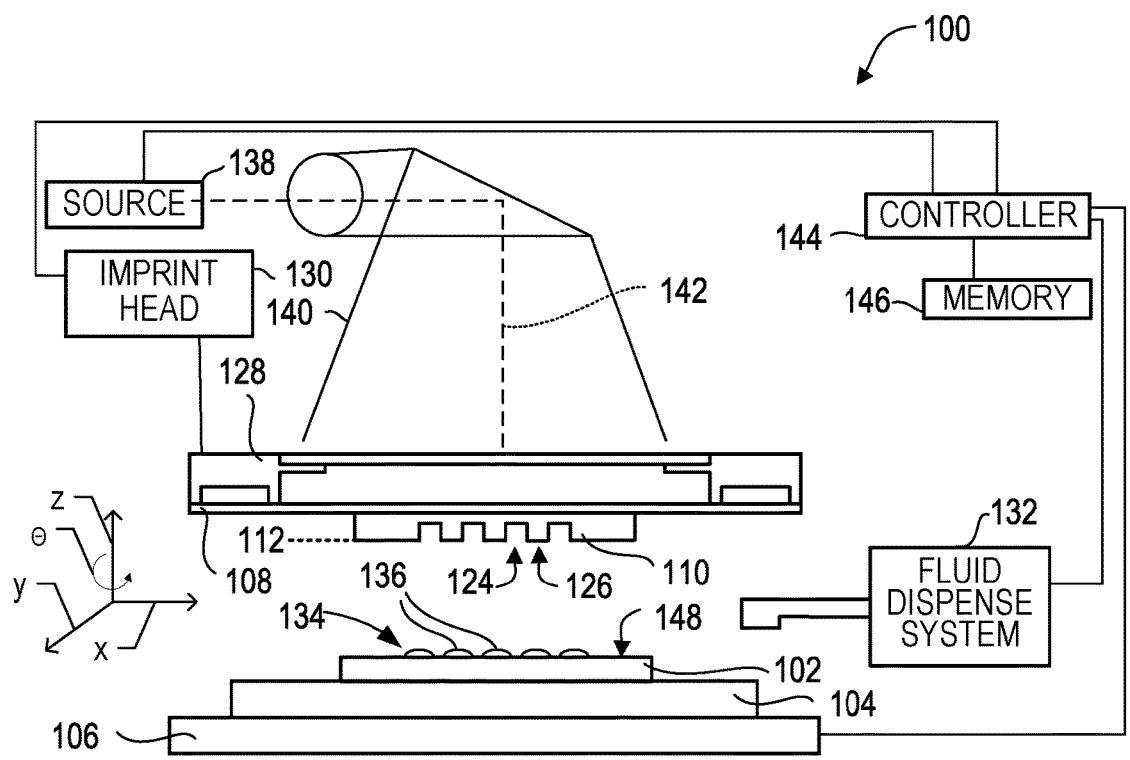
FIG. 1 depicts a side view of a nanoimprint lithography system.

FIG. 1 illustrates an imprint lithography system 100 that forms a relief pattern on a substrate 102. The substrate 102 may be coupled to a substrate chuck 104. In some examples, the substrate chuck 104 includes a vacuum chuck, a pin-type chuck, a groove-type chuck, an electromagnetic chuck, or other appropriate chuck. Exemplary chucks are described in U.S. Pat. No. 6,873,087, which is hereby incorporated by reference herein. The substrate 102 and the substrate chuck 104 may be further supported by a stage 106. The stage 106 provides motion about the x-, y-, and z-axes as well as rotation (e.g., θ) about the z-axis. In this regard, the stage 106 may refer to an XYθ stage. The stage 106, the substrate 102, and the substrate chuck 104 may also be positioned on a base (not shown).

The imprint lithography system 100 includes an imprint lithography template 108 that is spaced apart from the substrate 102. In some examples, the template 108 includes a mesa 110 (mold 110) that extends from the template 108 toward the substrate 102. In some examples, the mold 110 includes a patterning surface 112. The template 108 and/or the mold 110 may be formed from such materials including, but not limited to, fused-silica, quartz, silicon, organic polymers, siloxane polymers, borosilicate glass, fluorocarbon polymers, metal, hardened sapphire, or other appropriate material. In the illustrated example, the patterning surface 122 includes a plurality of features defined by spaced-apart recesses 124 and protrusions 126. However, in some examples, other configurations of features are possible. The patterning surface 112 may define any pattern that forms the basis of a pattern to be formed on substrate 102.

The template 108 may be coupled to a template chuck 128. In some examples, the template chuck 128 includes a vacuum chuck, a pin-type chuck, a groove-type chuck, an electromagnetic chuck, or any appropriate chuck. Exemplary chucks are described in U.S. Pat. No. 6,873,087. Further, the template chuck 128 may be coupled to an imprint head 130 such that the template chuck 128, the imprint head 130, or both are configured to facilitate movement of the template 108. Movement of the template 108 includes movement in the plane of the template (in-plane movement) and movement out of the plane of the template (out-of-plane movement) with respect to the template. In-plane movement includes translation of the template 108 in the plane of the template (e.g., in the X-Y plane as depicted in FIG. 1) and rotation of the template in the plane of the template (e.g., in the X-Y plane and about the Z axis). Translation or rotation of the template 108 with respect to the substrate 102 may also be achieved by translation or rotation of the substrate. In-plane movement of the template 108 also includes increasing or decreasing a compression force on opposite sides of the template (e.g., with a magnification actuator) to increase or decrease dimensions of the template in the X-Y plane of the template. Out-of-plane movement of the template 108 includes translation of the template along the Z-axis (e.g., to increase or decrease a force applied to the substrate via the template by increasing or decreasing the distance between the template and the substrate) and rotation of the template about an axis in the X-Y plane of the template. Rotation of template 108 about an axis in the X-Y plane of the template changes an angle between the X-Y plane of the template 108 and the X-Y plane of substrate 102, and is referred herein to as "tilting" the template with respect to the substrate, or changing a "tilt" or "tilt angle" of the template with respect to the substrate. U.S. Pat. No. 8,387,482 discloses movement of a template via an imprint head in an imprint lithography system, and is incorporated by reference herein.

The imprint lithography system 100 may further include a fluid dispense system 132. The fluid dispense system 132 may be used to deposit a polymerizable material 134 on the substrate 102. The polymerizable material 134 may be disposed on the substrate 102 using techniques such as drop dispense, spin-coating, dip coating, chemical vapor deposition (CVD), physical vapor deposition (PVD), thin film deposition, thick film deposition, or other appropriate method. In some examples, the polymerizable material 134 is disposed on the substrate 102 before or after a desired volume is defined between the mold 110 and the substrate 102. The polymerizable material 134 may include monomers as described in U.S. Pat. No. 7,157,036 and U.S. Patent Application Publication No. 2005/0187339, both of which are incorporated by reference herein. In some examples, the polymerizable material 134 is disposed on the substrate 102 as a plurality of droplets 136.

Figure 2:
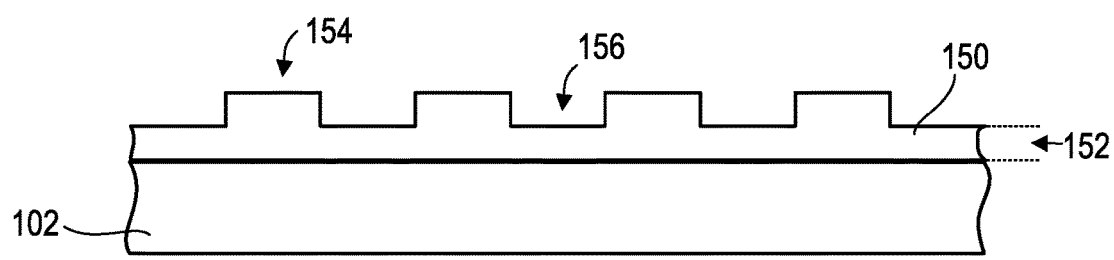
FIG. 2 depicts a side view of the substrate of FIG. 1.

Referring to FIGS. 1 and 2, the imprint lithography system 100 may further include an energy source 138 coupled to direct energy 140 along a path 142. In some examples, the imprint head 130 and the stage 106 are configured to position the template 108 and the substrate 102 in superimposition with the path 142. The imprint lithography system 100 may be regulated by a controller 144 in communication with the stage 106, the imprint head 130, the fluid dispense system 132, the energy source 138, or any combination thereof, and may operate on a computer readable program stored in a memory 146.

In some examples, the imprint head 130, the stage 106, or both, vary a distance between the mold 110 and the substrate 102 to define a desired volume therebetween that is filled by the polymerizable material 134. For example, the imprint head 130 may apply a force to the template 108 such that the mold 110 contacts the polymerizable material 134. After the desired volume is filled by the polymerizable material 134, the energy source 138 produces energy 140, such as broadband ultraviolet radiation, causing the polymerizable material 134 to polymerize and to conform to the shape of a surface 148 of the substrate 102 and the patterning surface 122, defining a polymeric patterned layer 150 on the substrate 102. In some examples, the patterned layer 150 includes a residual layer 152 and a plurality of features shown as protrusions 154 and recessions 156, with the protrusions 154 having a thickness t1 and the residual layer 152 having a thickness t2.

The above-described system and process may be further implemented in imprint lithography processes and systems referred to in U.S. Pat. No. 6,932,934, U.S. Patent Application Publication No. 2004/0124566, U.S. Patent Application Publication No. 2004/0188381, and U.S. Patent Application Publication No. 2004/0211754, all of which are incorporated by reference herein.

Imprint lithography substrates and templates may include corresponding pairs of alignment marks that allow real-time alignment of the template and the substrate. After the patterned template is positioned over the substrate (e.g., superimposed over the substrate), an alignment of the template alignment marks with respect to the substrate alignment marks is determined. Alignment schemes may include "through the mask" (TTM) measurement of alignment errors associated with pairs of corresponding alignment marks, followed by compensation of these errors to achieve accurate alignment of the template and a desired imprint location on the substrate as disclosed in U.S. Pat. Nos. 6,916,585; 7,170,589; 7,298,456; and 7,420,654, all of which are incorporated by reference herein. Alignment errors may be caused by relative positioning of the substrate and the template, deformation of the substrate or the template, or a combination thereof.

Figure 3:
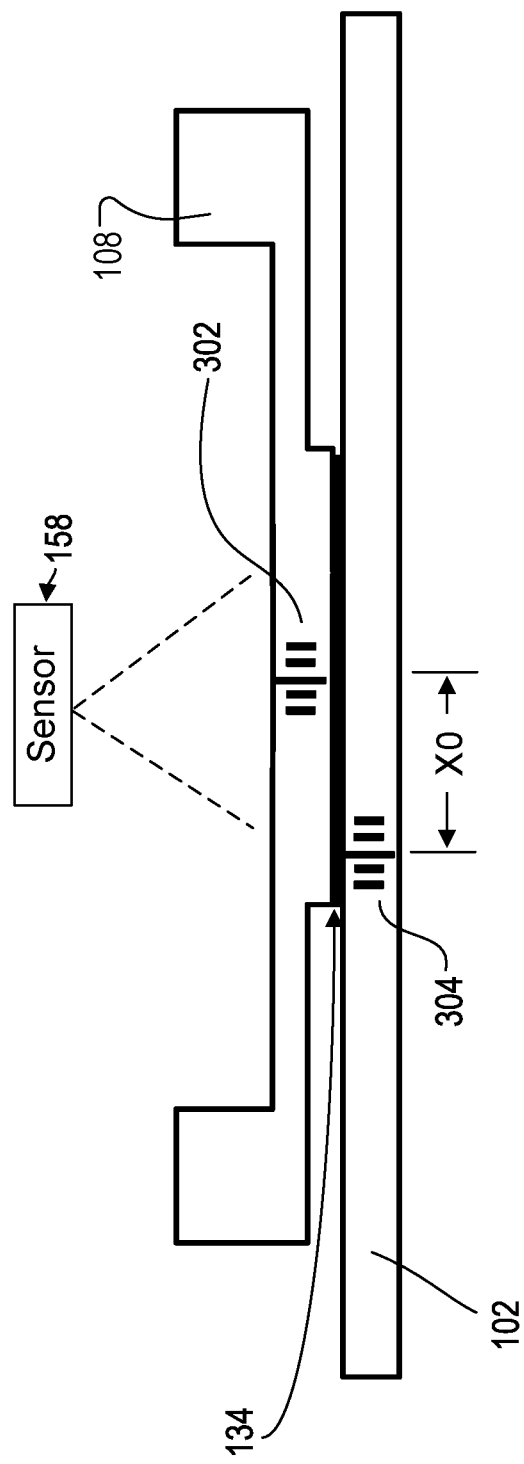
FIG. 3 depicts a side view of a nanoimprint lithography template in contact with a liquid imprint resist on a substrate, showing an initial alignment error X0 between an example pair of alignment marks on the template and the substrate, respectively.

FIG. 3 illustrates a side view of an imprint lithography template 108 in contact with a liquid imprint resist 134 on a substrate 102, showing a first or initial alignment error X0 between an example pair of alignment marks 302 and 304 on the template 108 and the substrate 102, respectively. The alignment error X0 may be measured by a sensor 158. In some examples, the sensor 158 includes a TTM alignment instrument configured to detect diffracted light from the alignment marks 302 and 304 in which the diffractive light may pass through the liquid imprint resist 134. The initial alignment error X0 may exceed a tolerable alignment error, which can be less than 10 nm with a repeatability of 1 nm or less, for instance.

The alignment error X0 may primarily be caused by placement error, rotation error, and/or compliance and hysteresis of the stage 106 (e.g., an XYθ stage), and may include the errors in the x- and y-axes and a rotation about the z-axis (θ). For example, the placement error generally refers to X-Y positioning errors between a template and substrate (that is, translation along the X axis, the Y axis, or both, where the X and Y axes are in the plane of or parallel to the imprinting surface of the template or the substrate, as depicted in FIG. 1). The rotation (θ) error generally refers to the relative orientation error about the Z axis (that is, rotation about the Z axis, where the Z axis is orthogonal to the X-Y plane as depicted in FIG. 1).

Placement errors in which a template alignment mark 302 and a corresponding substrate alignment mark 304 are offset in the X-Y plane may be compensated for by relative movement of the template and the substrate (e.g., by controlled movement of the substrate, the template, or both in the X-Y plane). Rotation errors may be compensated for by altering the relative angle of the template and substrate in the X-Y plane (e.g., by rotation of the substrate, the template, or both).

Figure 4:
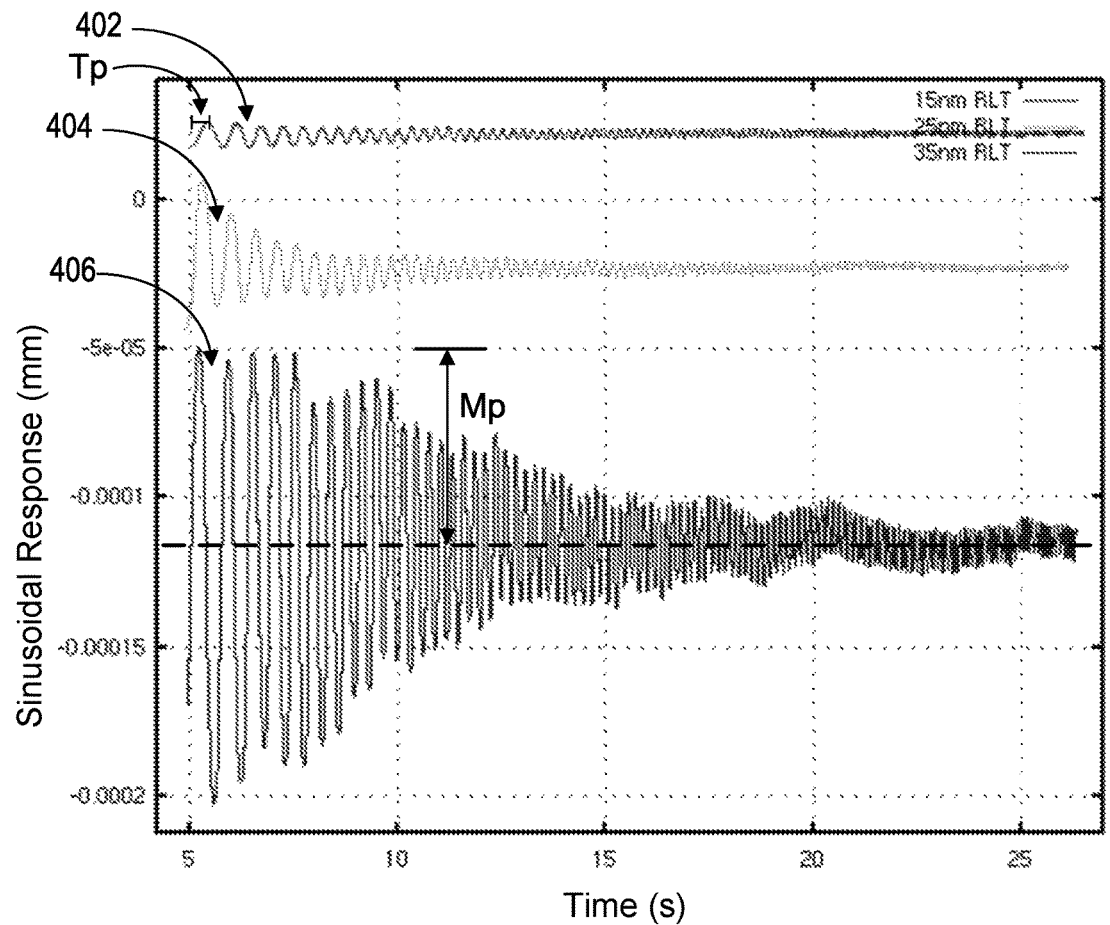
FIG. 4 is a graph of example responses to a sinusoidal input to a nanoimprint lithography stage, showing different responses for substrates having different residual layer thicknesses.

FIG. 4 is a graph of example responses to a sinusoidal input to a nanoimprint lithography stage 106 for system identification, showing different responses for substrates having different residual layer thicknesses (RLT). For example, the response curve 402 represents oscillation of a relative distance between the alignment marks 302 and 304 for a substrate 102 with 15 nm RLT in response to a sinusoidal input to the stage 106. Similarly, the response curves 404 and 406 represent oscillation of relative distances between the alignment marks 302 and 304 for substrates 102 with 25 nm RLT and 35 nm RLT, respectively.

As shown in FIG. 4, the response curves 402, 404, and 406 can be analyzed in terms of a peak time Tp which is the time taken for each response to reach the first peak of the overshoot. The peak time Tp may correspond to a phase of the response or delay of the system. In this example, the substrate 102 with 15 nm RLT experiences greater friction and responds slower than the 25 nm and 35 nm RLT cases. The magnitude and phase of the response may be a function of RLT as well as various other factors such as an input frequency, patterns on the substrate 102 or the template 108, compliance of the stage 106, or hysteresis, etc. In other examples, system identification may be performed by analyzing transient responses to other input signals such as an impulse input or a step input.

Figure 5:
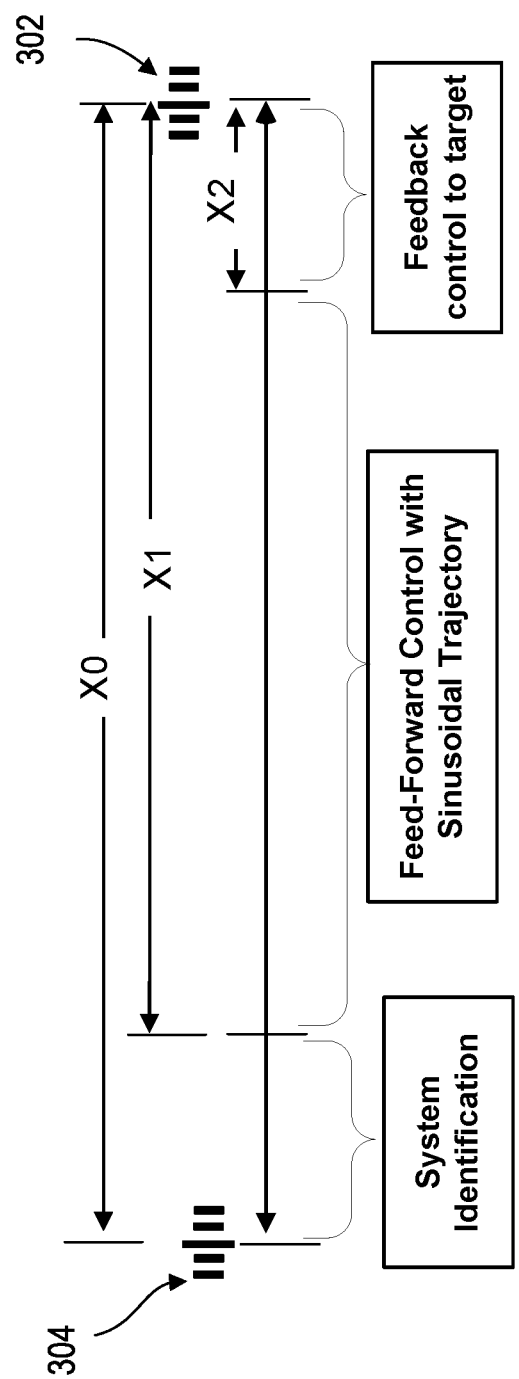
FIG. 5 shows example control steps to correct the initial alignment error X0 of FIG. 3.

FIG. 5 shows example control steps to correct the initial alignment error X0 of FIG. 3. Because of non-linearity of the alignment system (e.g. non-linear damping caused by the liquid imprint resist and stage 106 compliance), correcting the alignment error X0 based on only linear dynamics may limit alignment throughput or speed and overlay accuracy. For example, relative motion between the substrate 102 and the template 108, in particular, at the beginning of the motion may experience static sticky friction force that restricts the initial motion until input force exceeds a threshold force to overcome the friction force. In another example, there may be a time delay between an input signal and an output motion of the stage 106 (therefore the substrate 102). In some cases, there may be hysteresis in the system 100, in particular, in the stage 106 of the system 100 that retains the substrate 102. In other words, relative motion between the substrate 102 and the template 108 may depend on how the relative motion changed in the past. In other cases, there may be compliance (e.g., linear or non-linear elasticity) in the stage 106 which may cause discrepancy between the input signal and the output motion.

A system identification step shown in FIG. 5 may characterize non-linear behaviors of the system 100 (e.g., the stage 106) such as friction, hysteresis, or compliance, etc. described above in the beginning of an alignment process and generate a dynamic model of the system 100. For example, the stage 106 initiates a relative motion between the substrate 102 and the template 108 based on a first input signal from a controller. The first input signal may be a feed-forward control signal provided through a feed-forward controller to initiate the relative motion of a distance X0-X1 for a short period of time less than 0.2 seconds, for instance. The time period for the system identification step can be about 30-40% of a total time budget for aligning the template 108 to a field of the substrate 102. In some examples, the system identification step is performed for a period of time starting from an initial sticky status until the relative motion becomes a sliding status. In some examples, the first input signal is predetermined based on a calculated non-linear model to handle static motion, hysteresis, and compliance. In other cases, the first input signal may be determined based on a previous data or a look-up table corresponding to the first alignment error X0. For example, if the first alignment error X0 is 100 nm and needs to be corrected within 500 msec, the first input signal can be determined by a function of time $100*\sin(2\pi \cdot ct)$, where c is a constant that is greater than or equal to 2 to set a frequency of the first input signal according to the given alignment time 500 msec.

The sensor 158 (e.g., TTM device) may measure a resultant motion of the substrate 102 relative to the template 108 initiated by the first input signal. In some implementations, the system includes a non-linear state observer (e.g., extended non-linear state observer) that can process both the input signal and the resultant motion to estimate an internal state of the system 100 in which the internal state may include model parameters such as a position component ($0^{th}$ order), a velocity component ($1^{st}$ order), an acceleration component ($2^{nd}$ order), a jerk component ($3^{rd}$ order), . . . , and Nth order component. Based on the input signal and the measured resultant motion, the non-linear behaviors of the system 100 may be described as a non-linear dynamic model, and relationship between the input signal and the resultant motion can be expressed with a transfer function.

The model parameters identified in the system identification step may be decomposed using a sinusoidal function of time with a single frequency $\omega$ to generate a feed-forward control signal FF(t). For example, the feed-forward control signal FF(t) may be calculated using following equation in which $Kff_{step}(t)$ represents a sliding mode feed-forward control signal from the state observer, and Kff(i) represents a gain value for each dynamic component such as position, velocity, and acceleration, etc. which is multiplied by a sine function with a frequency $\omega$ and a phase of $-\pi/2+(i-1)*\pi/2$.

$$FF(t) = Kff_{step}(t) + \sum_{i=1}^{N} Kff(i) * \sin(\omega t - \pi/2 + (i-1)*\pi/2)$$

The high order terms such as Kff(1) may corresponds to friction force between the substrate 102 and the template 108. In some examples, the frequency $\omega$ is determined by a required converging time which may be in the range from 0.1 to 1 sec.

The feed-forward control signal FF(t), which has been generated by sinusoidal decomposition, may yield a smooth motion control action for a second relative motion between the substrate 102 and the template 108 to drive the stage 106 to reduce the initial alignment error X0. Since successive derivatives of a sine function are a cosine function or a sine function, the motion trajectory can be constructed as a smooth function of time without excitation of alignment control system resonance that can diverge an alignment error or cause system instability. The stage 106 may be controlled to initiate the second relative motion following the smooth motion trajectory. In some examples, the sensor 185 and the state observer 612 (see FIG. 6) keep monitoring the alignment status and a dynamic state of the stage 106 to determine (a) a second alignment error X2 and (b) linearity of the second relative motion.

In some implementations, the second alignment X2 error can be corrected by feedback control to quickly converge to a control target to achieve a zero mean alignment error between the alignment marks 302 and 304. For example, once the second relative motion follows a linear dynamic model or moves into a linear model dominant domain where the stage 106 smoothly slides, the feed-forward control signal decreases, and a feedback control signal from a feedback controller drives the stage 106 to reduce the alignment error to zero. The sensor 158 may measure an alignment error such as a distance between the alignment marks 302 and 304 and generate a measurement signal that corresponds to the alignment error. The feedback controller may generate a feedback control signal based on the measurement signal and a target value (e.g., zero). The stage 106 initiate a further relative motion based on the feedback control signal. In some examples, the feedback control process describe above is repeated until a tolerable alignment error is achieved. In some cases, where the second alignment X2 (e.g., a residual error) is large for a feedback control, an additional feed-forward control step may be performed before the transition to feedback control. Typically, an additional feed-forward control step is not necessary if the system 100 has been accurately characterized in the system identification step.

Figure 6:
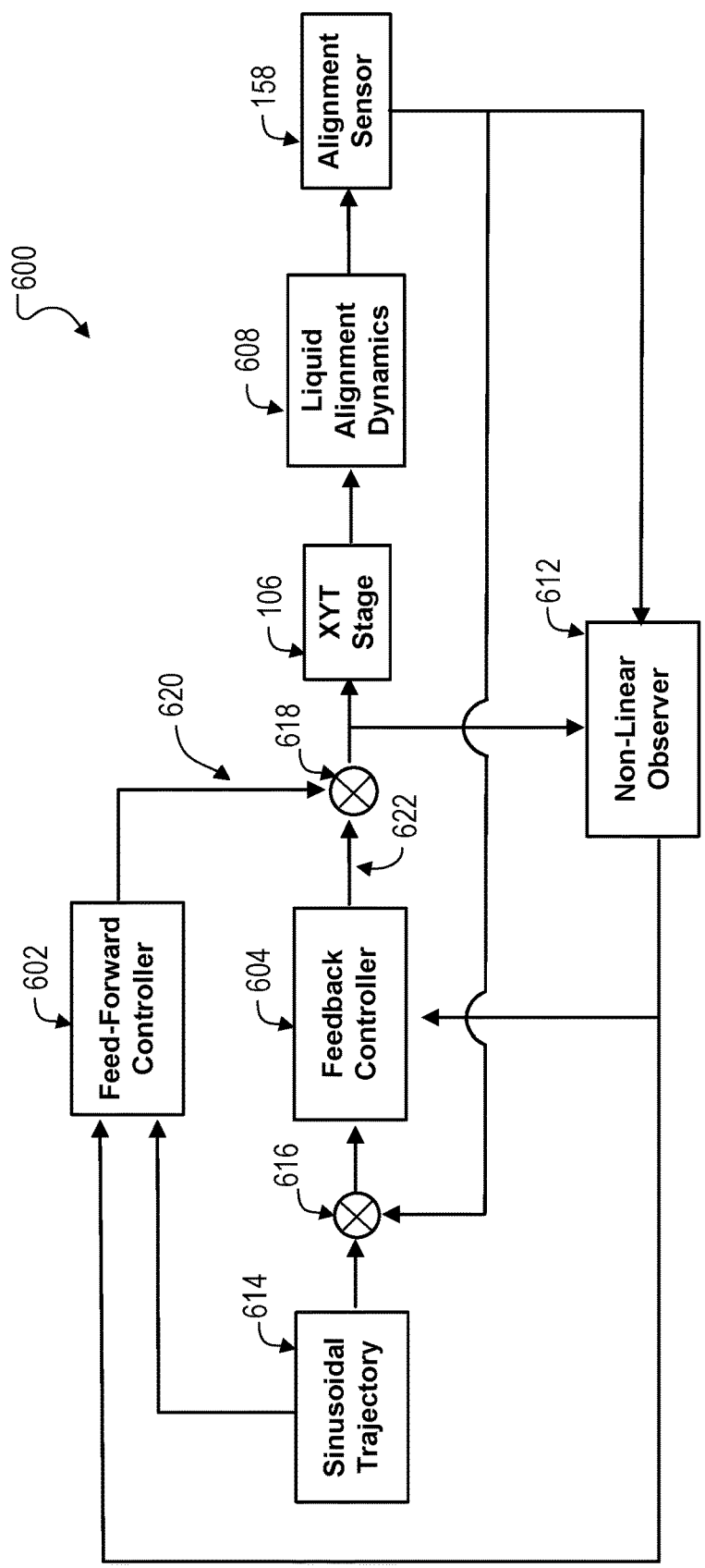
FIG. 6 shows an example control block diagram for feed-forward control based on a sinusoidal motion trajectory.

FIG. 6 illustrates an example control block diagram for feed-forward and feedback control based on a sinusoidal motion trajectory. The control system 600 includes a feed-forward controller 602, a feedback controller 604, an XYT stage 106, an alignment sensor 158, and a non-linear state observer 612. The stage 106 receives control signals from the feed-forward controller 602 and feedback controller 604 and is driven to a control target (e.g., a zero alignment error). In some examples, the stage 106 responds to the control signals via liquid alignment dynamics 608 which may be non-linear. In some examples, the non-linear state observer 612 monitors the control signals to the stage 106 and an alignment error measured by sensor 158, and provide state information to the feed-forward controller 602 and to the feedback controller 604.

The sinusoidal motion trajectory 614, which has been generated based on system identification in the beginning of an alignment process as described with regard to FIG. 5, is provided to the feed-forward controller 602 and converted to an electrical signal or a feed-forward control signal to the stage 106. In some examples, the sinusoidal motion trajectory is combined with a measurement signal from the sensor 158 and provided to the feedback controller 604. In this example, the sinusoidal motion trajectory is also used for the feedback controller 604 to calculate an adjustment following the alignment error during the transitioning phase from the feed-forward control to the feedback control, which also helps to avoid an excitation of resonance of the alignment system causing a system instability. The alignment sensor 158 may measure an alignment error such as a distance between the alignment marks 302 and 304, and provide a measurement signal corresponding to the alignment error to the state observer 612 and feedback controller 604. The junctions 616 and 618 may merge control signals by adding, subtracting, or convoluting each other. For example, the junction 618 between the feedback controller 604 and the stage 606 may add the feed-forward control signal 620 that is dominant in the beginning of the alignment process and the feedback control signal 622 which is dominant later in the alignment process.

Figure 7A:
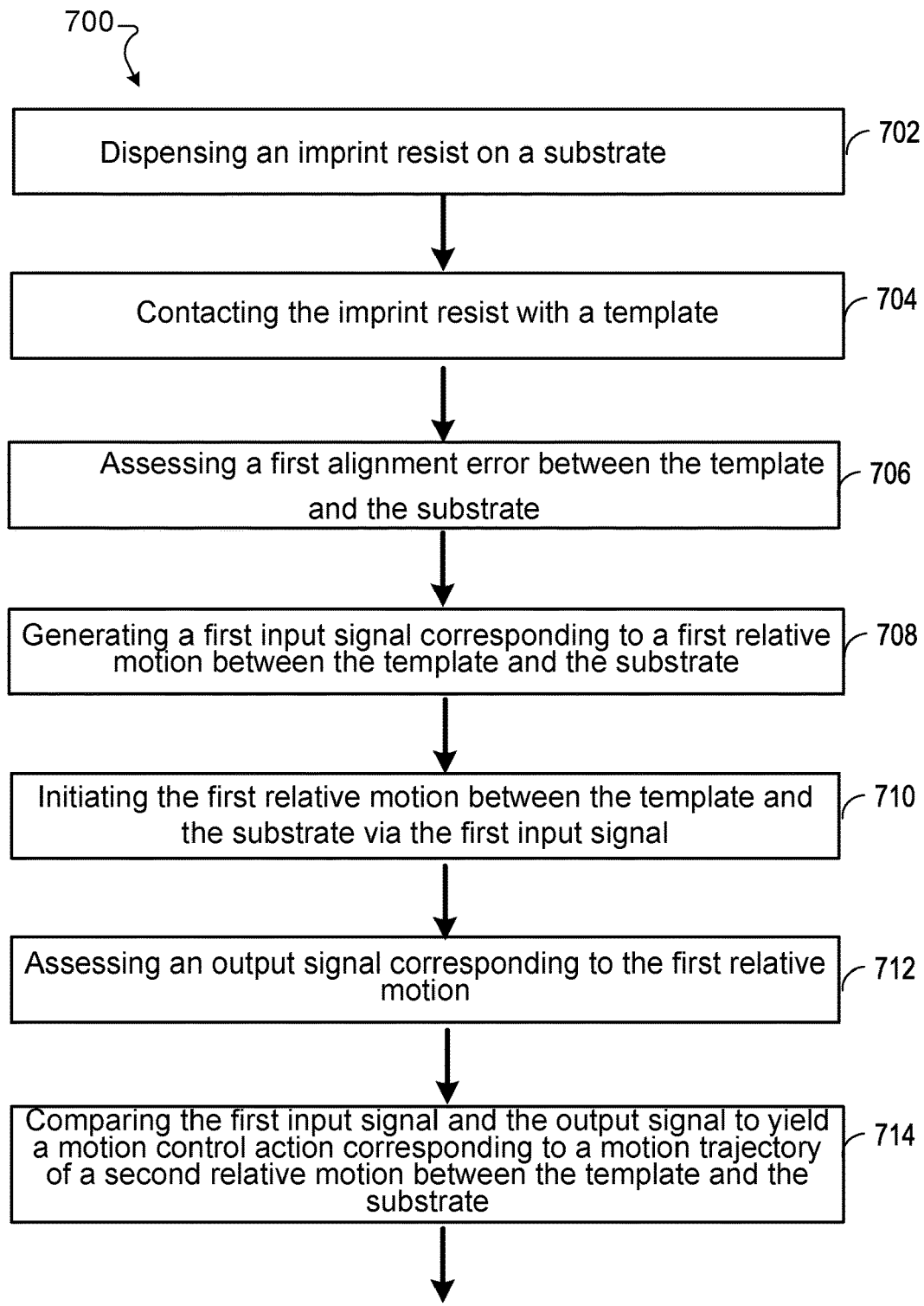
FIGS. 7A-7B show a flowchart for a process for correcting an alignment error based on system identification and a motion control action generated based on the system identification.
Figure 7B:
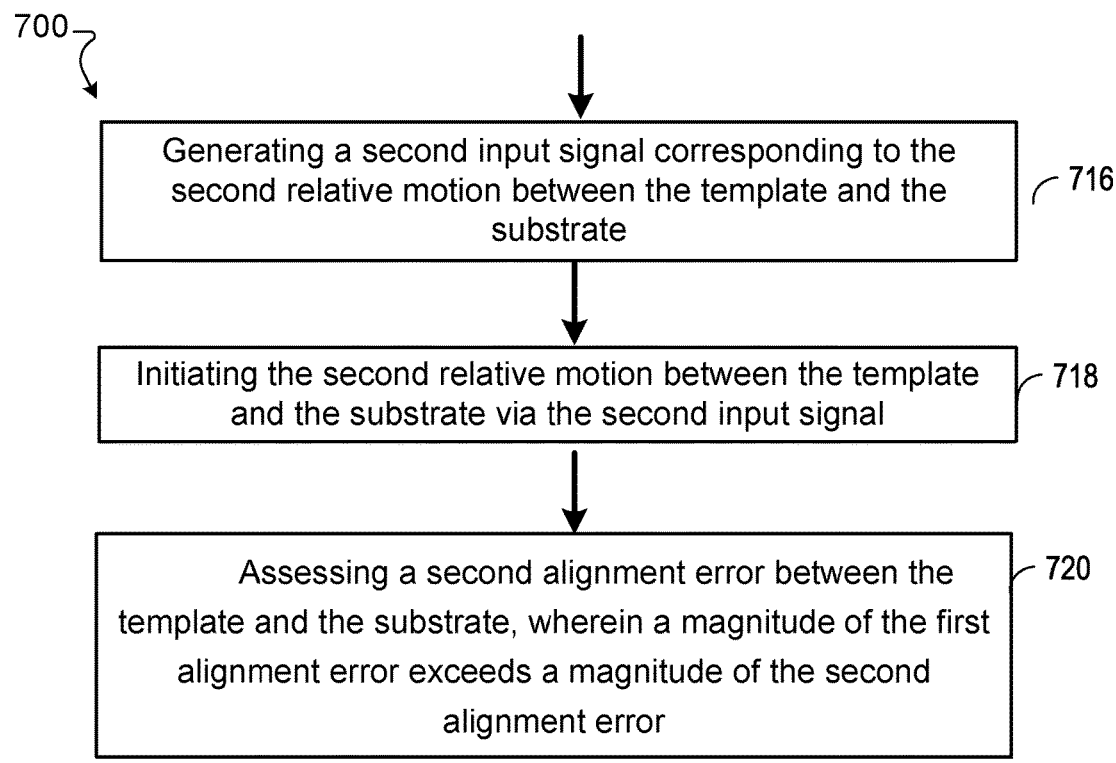

FIGS. 7A-7B show a flowchart for operations in an imprint lithography process 700 to perform system identification of an alignment control system and to drive the alignment control system to an alignment condition using a smooth motion trajectory. In 702, an imprint resist is disposed on a substrate (e.g., an imprint field of a substrate). In 704, the imprint resist is contacted with a template. The template includes an alignment mark, and the substrate includes an alignment mark that corresponds to the alignment mark of the template. In 706, a first alignment error between the template and the substrate is assessed based on a distance or an angle between the alignment marks to generate a controlled motion action of relative motion between the template and the substrate. In 708, a first input signal corresponding to a first relative motion between the template and the substrate is generated for system identification. In 710, the first relative motion between the template and the substrate is generated via the first input signal. In 712, an output signal corresponding to the first relative motion is assessed. For example, the alignment control system includes a sensor to measure a relative position of the substrate with respect to the template and generate the output signal corresponding to the relative position. In 714, the first input signal and the output signal are compared to yield a motion trajectory of a second relative motion between the template and the substrate. In 716, a second input signal is generated corresponding to the second relative motion between the template and the substrate. In 718, the second relative motion between the template and the substrate is initiated via the second input signal. In 720, a second alignment error between the template and the substrate is accessed. A magnitude of the first alignment error exceeds a magnitude of the second alignment error.

Figure 8:
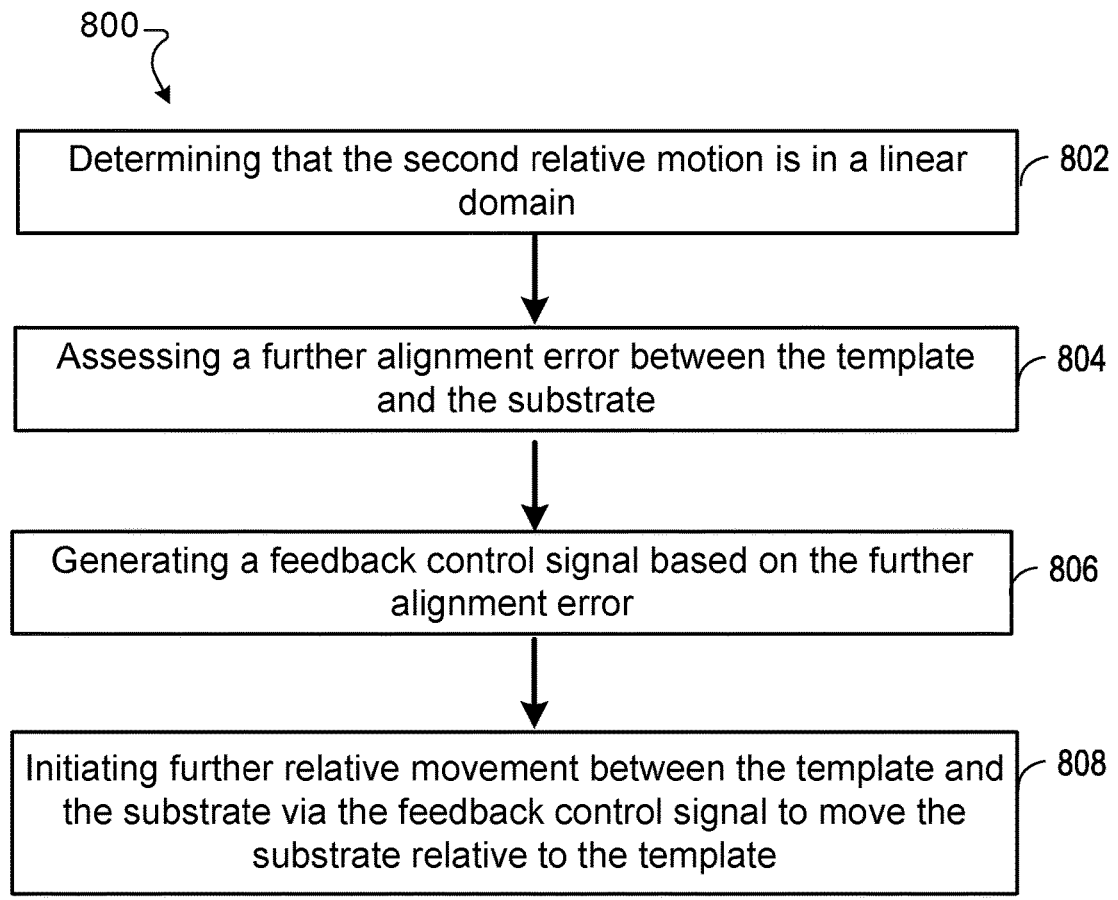
FIG. 8 is a flowchart for a process for correcting a further alignment error based on feedback control.

FIG. 8 is a flowchart for example operations in an imprint lithography process 800 to reduce alignment errors of an imprint lithography template with respect to a substrate using feedback control. In some implementations, process 700 is followed by process 800. In 802, the second relative motion is determined to be in a linear domain. In 804, a further alignment error between the template and the substrate is assessed. In 806, a feedback control signal is generated based on the further alignment error. In 808, further relative movement is initiated between the template and the substrate via the feedback control signal to move the substrate relative to the template. In some implementations, process 800 may be repeated to achieve an alignment target.

Processes 700 and 800 have been illustrated as a collection of referenced acts arranged in a logical flow graph. The order in which the acts are described is not intended to be construed as a limitation, and any number of the described acts can be combined in another order or in parallel to implement the process.

Figure 9A:
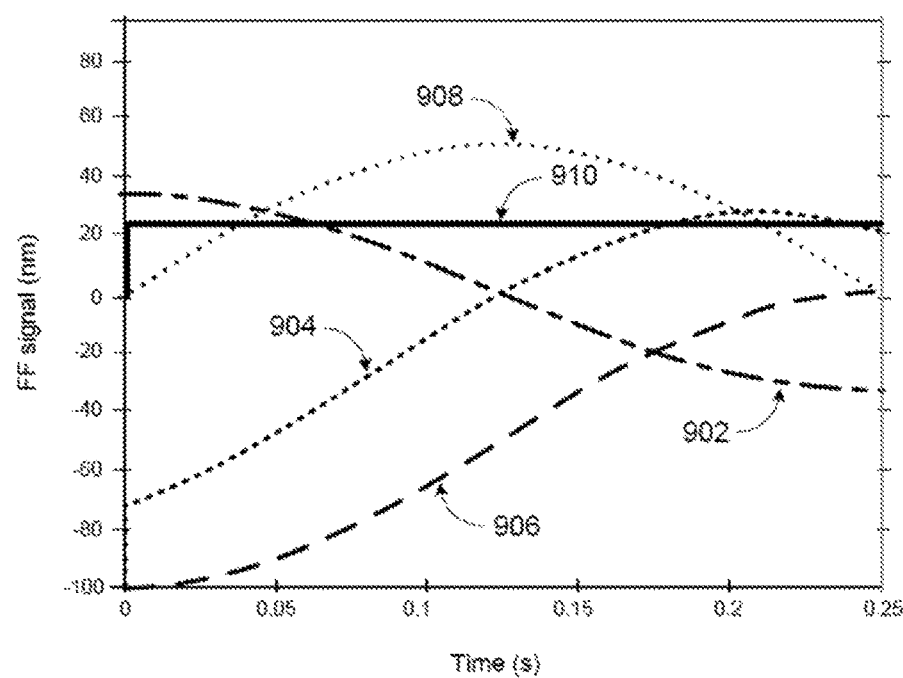
FIG. 9A is a graph of an example motion trajectory and feed-forward signal for the motion trajectory, showing curves representing a position component, a velocity component, an acceleration component of the motion trajectory, and the feed-forward signal.
Figure 9B:
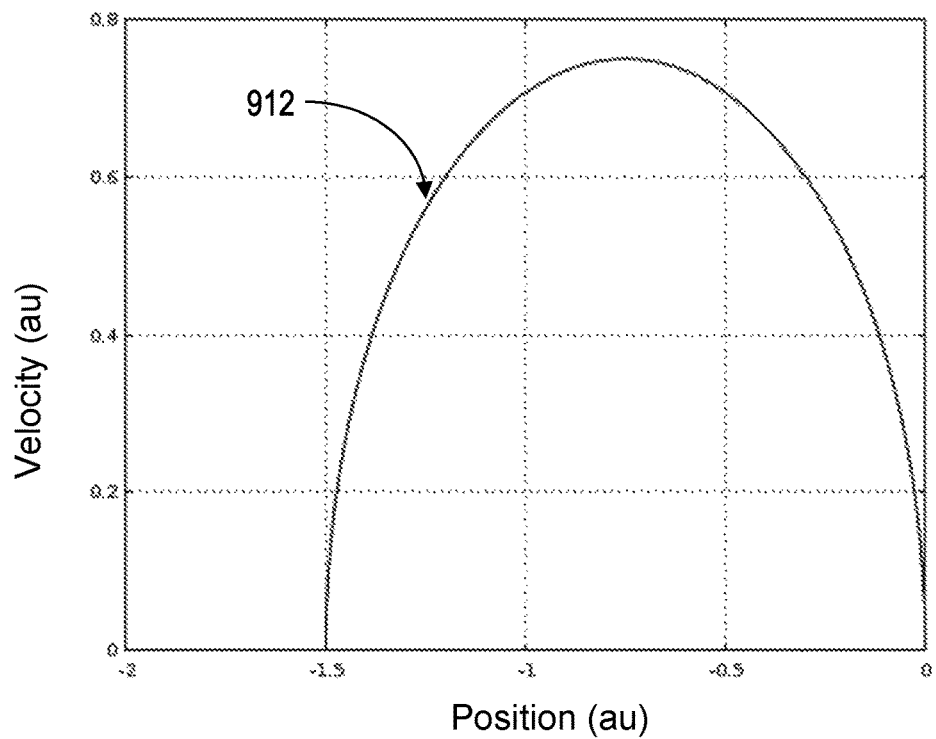
FIG. 9B is a graph of an example two-dimensional super-surface of the motion trajectory showing a curve representing positions versus velocities of a substrate relative to a template of nanoimprint lithography.

FIG. 9A is a graph of an example motion trajectory and feed-forward signal for the motion trajectory as a function of time. The curves 904, 906, 908, and 902 respectively represent a position component, a velocity component, an acceleration component of the motion trajectory, and the feed-forward signal 902. The curve 910 represents a single step sliding mode signal from the state observer. The feed-forward signal represented by the curve 902 may be generated by adding the dynamic components represented by the curves 904, 906, and 908, which are in sinusoidal forms to yield a smooth motion trajectory, to the single step sliding mode signal represented by the curve 910. FIG. 9B is a graph of an example two-dimensional super-surface of the motion trajectory showing a curve 912 representing positions versus velocities of a substrate relative to a template of nanoimprint lithography. For example, the super-surface curve 912 is a graph of the position component curve 904 versus the velocity component curve 906 at various times.

Figure 10:
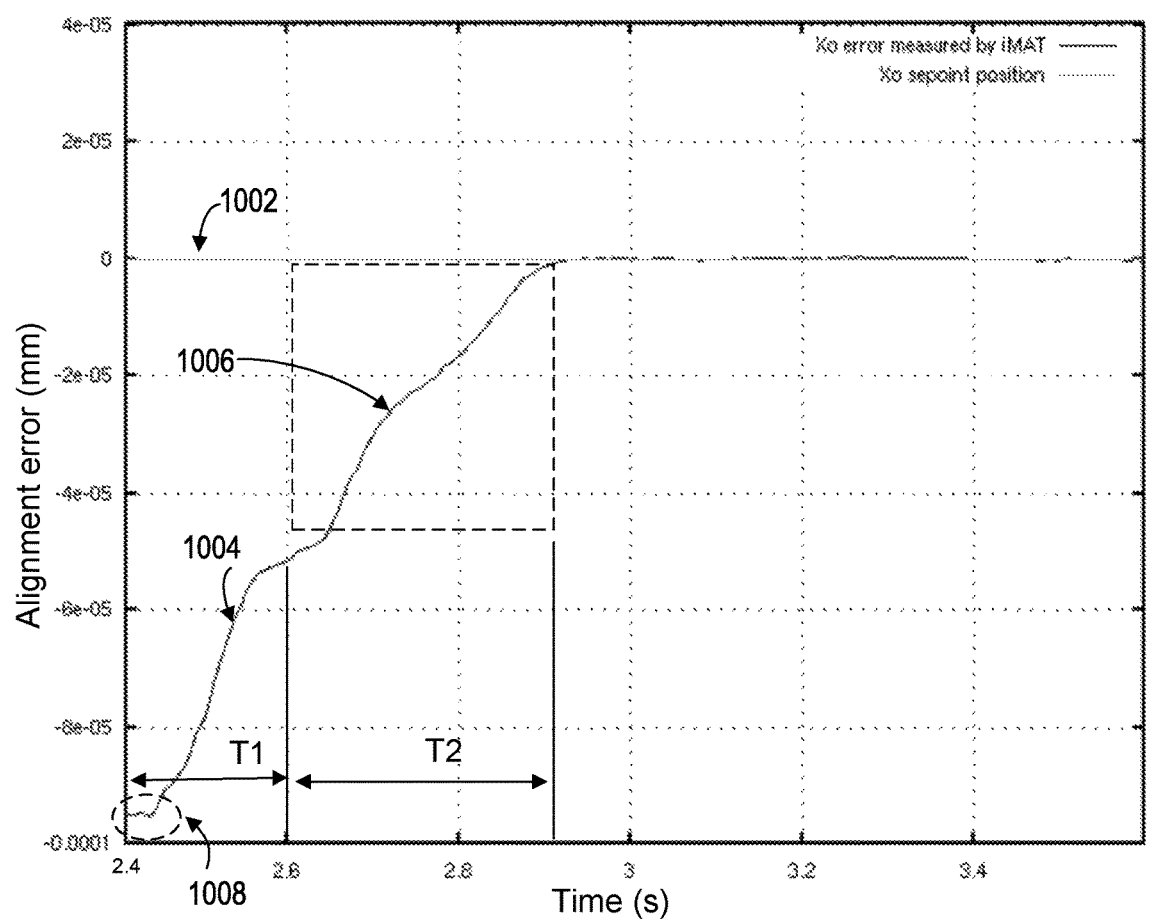
FIG. 10 is a graph of an example result of alignment control utilizing system identification and sinusoidal motion trajectory, showing a set point and alignment errors from the set point with respect to time.

FIG. 10 is a graph of an example result of alignment control utilizing system identification and a sinusoidal motion trajectory, showing a set point 1002 and alignment errors from the set point with respect to time. In this example, a system identification step is performed in a time range T1 (~0.2 seconds) in the beginning of an alignment process. The curve section 1004 for the time range T1 represents relative motion of a substrate relative to a template during the system identification step. In this example, the system shows static sticky motion 1008 due to friction as the alignment error value does not change much in the initial about 0.05 seconds when the substrate may move together with the template resulting in no relative movement. In the time period T2 (~0.3 seconds) following the system identification step in T1, the curve section 1006 the relative motion follows the sinusoidal motion trajectory. In this example, an overlay throughput of 0.5 seconds or less is achieved including the quick system identification step. In other examples, faster overlay throughput may be possible depending on an overlay target.

A number of implementations have been described. Nevertheless, it will be understood that various modifications may be made without departing from the spirit and scope of the disclosure. Accordingly, other implementations are within the scope of the following claims.

What is claimed is:

1. An imprint lithography alignment method comprising:
   dispensing an imprint resist on a substrate;
   contacting the imprint resist with a template, wherein the imprint resist is a liquid;
   assessing a first alignment error between the template and the substrate;
   generating a first input signal corresponding to a first relative motion between the template and the substrate;
   initiating the first relative motion between the template and the substrate via the first input signal;
   assessing an output signal corresponding to the first relative motion;

comparing the first input signal and the output signal to yield a motion control action corresponding to a motion trajectory of a second relative motion between the template and the substrate;
generating a second input signal corresponding to the second relative motion between the template and the substrate;
initiating the second relative motion between the template and the substrate via the second input signal; and
assessing a second alignment error between the template and the substrate, wherein a magnitude of the first alignment error exceeds a magnitude of the second alignment error.

2. The method of claim 1, wherein the magnitude of the second alignment error is less than or equal to a target alignment error.

3. The method of claim 1, wherein comparing the first input signal and the output signal comprises:
assessing a ratio of a magnitude of the output signal to a magnitude of the first input signal; and
assessing a phase of the output signal with respect to a phase of the first input signal.

4. The method of claim 1, wherein the motion trajectory includes a sinusoidal function of time that spans a phase value from $-\pi/2$ to $\pi/2$.

5. The method of claim 1, wherein the motion trajectory comprises position, velocity, acceleration, and jerk components, and
wherein the jerk component corresponds to static friction between the template and the imprint resist on the substrate in the first relative motion.

6. The method of claim 5, wherein the motion control action is a sum of the position, velocity, and acceleration components.

7. The method of claim 1, wherein generating the second input signal comprises converting the motion control action to an electrical signal through a feed-forward controller.

8. The method of claim 1, wherein assessing the output signal comprises assessing the output signal using a non-linear state observer.

9. The method of claim 1, wherein initiating the first relative motion comprises providing the first input signal for a predetermined length of time to a stage on which the substrate is disposed.

10. The method of claim 1, further comprising:
i) assessing a further alignment error between the template and the substrate;
ii) generating a feedback control signal based on the further alignment error; and
iii) initiating further relative movement between the template and the substrate via the feedback control signal to move the substrate relative to the template.

11. The method of claim 10, further comprising:
iv) repeating i) through iii) until a mean value of the further alignment error is less than or equal to a target alignment error.

12. An imprint lithography system for controlling alignment of an imprint lithography template with respect to a substrate based on system identification, the system comprising:
a substrate stage configured to retain the substrate; and
a controller in communication with the substrate stage configured to, based on the substrate having a liquid imprint resist contacting the template:
assess a first alignment error between the template and the substrate;
generate a first input signal corresponding to a first relative motion between the template and the substrate;
initiate the first relative motion between the template and the substrate via the first input signal;
assess an output signal corresponding to the first relative motion;
compare the first input signal and the output signal to yield a motion control action corresponding to a motion trajectory of a second relative motion between the template and the substrate;
generate a second input signal corresponding to the second relative motion between the template and the substrate;
initiate the second relative motion between the template and the substrate via the second input signal; and
assess a second alignment error between the template and the substrate, wherein a magnitude of the first alignment error exceeds a magnitude of the second alignment error.

13. The system of claim 12, wherein the controller comprises a feed-forward controller configured to convert the motion trajectory to an electrical signal and provide the electrical signal to the substrate stage.

14. The system of claim 13, further comprising a sensor configured to generate a sensor signal corresponding to a relative location of the template with respect to the substrate, wherein the controller is configured to receive the sensor signal for assessing the output signal and the second alignment error.

15. The system of claim 14, wherein the controller comprises a state observer configured to assess the output signal based on the electrical signal from the feed-forward controller and the sensor signal to yield the motion control action.

16. The system of claim 12, wherein the motion trajectory includes a sinusoidal function of time that spans a phase value from $-\pi/2$ to $\pi/2$.

17. The system of claim 12, wherein the controller is further configured to:
i) assess a further alignment error between the template and the substrate;
ii) generate a feedback control signal based on the further alignment error; and
iii) initiate further relative movement between the template and the substrate via the feedback control signal to move the substrate relative to the template.

18. The system of claim 17, wherein the controller is further configured to repeat i) through iii) until a mean value of the further alignment error is less than or equal to a target alignment error.

19. The system of claim 17, wherein the controller further comprises a feedback controller configured to generate the feedback control signal and provide the feedback control signal to the substrate stage.

20. The system of claim 12, wherein the substrate stage is configured to translate the substrate about orthogonal axes in a plane of the template and rotate the substrate about a center axis orthogonal to the plane.

* * * * *